(12) United States Patent  (10) Patent No.: US 7,714,632 B2
Cho                       (45) Date of Patent:     May 11, 2010

(54) CLOCK CONTROL CIRCUIT AND SEMICONDUCTOR INTEGRATED CIRCUIT USING THE SAME

(75) Inventor: Jin Hee Cho, Ichon (KR)

(73) Assignee: Hynix Semiconductor Inc. (KR)

( * ) Notice: Subject to any disclaimer, the term of this patent is extended or adjusted under 35 U.S.C. 154(b) by 47 days.

(21) Appl. No.: 11/962,033

(22) Filed: Dec. 20, 2007

(65) Prior Publication Data

US 2008/0191763 A1    Aug. 14, 2008

(30) Foreign Application Priority Data

Feb. 9, 2007    (KR) .............. 10-2007-0014063

(51) Int. Cl.
 *H03K 3/00*    (2006.01)
(52) U.S. Cl. .............. 327/291; 327/172; 327/175; 327/299
(58) Field of Classification Search ......... 327/172–176, 327/291–294, 299
See application file for complete search history.

(56) References Cited

U.S. PATENT DOCUMENTS 5,124,572 A    6/1992    Mason et al.
5,583,431 A *  12/1996   Ouchi et al. .............. 324/174
5,638,016 A *  6/1997    Eitrheim ................... 327/175
5,703,513 A    12/1997   Hashizume et al.
5,926,434 A    7/1999    Mori
6,192,004 B1 * 2/2001    Aikawa et al. ........... 365/233.1
6,232,811 B1   5/2001    Ihm
6,323,706 B1 * 11/2001   Stark et al. .............. 327/175
6,529,423 B1   3/2003    Yoon et al.

FOREIGN PATENT DOCUMENTS

JP    09-074337       3/1997
KR    1020030003340 A  1/2003

* cited by examiner

*Primary Examiner*—An T Luu
(74) *Attorney, Agent, or Firm*—Baker & McKenzie LLP

(57) ABSTRACT

A clock control circuit includes a first signal generation block for outputting a first internal clock signal, which is enabled after delay of a first time from a rising edge of a first input clock signal and has a high level pulse width shorter by a second time than a high level pulse width of the first input clock signal, and a second signal generation block for outputting a second internal clock signal, which is enabled after delay of the first time from a rising edge of a second input clock signal and has a high level pulse width shorter by the second time than a high level pulse width of the second input clock signal.

15 Claims, 3 Drawing Sheets

CLOCK CONTROL CIRCUIT AND SEMICONDUCTOR INTEGRATED CIRCUIT USING THE SAME

CROSS-REFERENCES TO RELATED APPLICATIONS

The present application claims priority under 35 U.S.C. 119(a) to Korean application number 10-2007-0014063, filed on Feb. 9, 2007, in the Korean Patent Office, which is incorporated by reference in its entirety as if set forth in full.

BACKGROUND

1. Technical Field

The embodiments described herein relate to a semiconductor integrated circuit, and more particularly, to a clock control circuit and a semiconductor integrated circuit using the same.

2. Related Art

Semiconductor integrated circuits with a high integration level and capable of operating at a high speed are increasingly in demand. Specifically, these high speed circuits include DLL (delay-locked loop) circuits to implement read operations in synchronization with external clock signals.

As is well known in the art, a DLL circuit is provided to control the output timing of a signal (for example, data, etc.), which is output by a semiconductor integrated circuit, in synchronization with the clock signal, which is input to the semiconductor integrated circuit. In detail, since timing delay occurs when the clock signal received by the semiconductor integrated circuit is used within the semiconductor integrated circuit, a DLL circuit is employed to control the timing delay and allow the clock signal used within the semiconductor integrated circuit to be synchronized with the clock signal received by the semiconductor integrated circuit.

An SDRAM (synchronous dynamic random access memory), for example, includes a DLL circuit to implement read operations in synchronization with external clock signals. As a consequence, the SDRAM is controlled in a read operation mode by the rising and falling clock signals generated by the DLL circuit, so that data can be output precisely in synchronization with the rising and falling edges of the external clocks signals. Meanwhile, the enable timing of output data is controlled so that a duty ratio can always be satisfied irrespective of a data pattern.

In general, in order to maintain the duty ratio between clock signals at 50:50, the rising and falling clock signals are controlled such that the rising edge of the rising clock signal and the falling edge of the falling clock signal cross at an intermediate point between a high level and a low level and the falling edge of the rising clock signal and the rising edge of the falling clock signal cross at the intermediate point between the high level and the low level. Therefore, when an output buffer is driven, as data is pulled up and pulled down depending upon the pattern of output data, an overlap of two signals occurs, and due to this fact, a PMOS transistor and an NMOS transistor in a pre-driver or an output buffer are simultaneously turned on and off, which serves as noise in the data output and can cause distortion and increase power consumption.

SUMMARY

In one aspect, an internal clock control circuit is provided that implements control operation to prevent the falling edge of a rising clock signal and the rising edge of a falling clock signal from crossing with each other while maintaining a duty ratio between the internal clock signals, thereby reducing noise generation and power consumption in a pre-driver or a data output buffer, and a semiconductor integrated circuit using the same.

In another aspect, an internal clock control circuit is provided that can prevent the rising edge of a clock signal and the falling edge of another signal from crossing with each other, and also prevent the falling edge of the clock signal and the rising edge of the other signal from crossing with each other.

According to another aspect, there is provided a clock control circuit comprising a first signal generation block for outputting a first internal clock signal, which is enabled after delay from a rising edge of a first input clock signal and has a high level pulse width that is shorter than a high level pulse width of the first input clock signal, and a second signal generation block for outputting a second internal clock signal, which is enabled after a delay from a rising edge of a second input clock signal and has a high level pulse width that is shorter than a high level pulse width of the second input clock signal.

According to another aspect, there is provided a semiconductor integrated circuit comprising a DLL circuit for outputting a DLL clock signal in response to an external clock signal, a signal generation block for outputting an internal clock signal, which is enabled after delay from a rising edge of the DLL clock signal and has a high level pulse width that is shorter than a high level pulse width of the DLL clock signal, and an output driver for receiving, buffering and outputting the internal clock signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
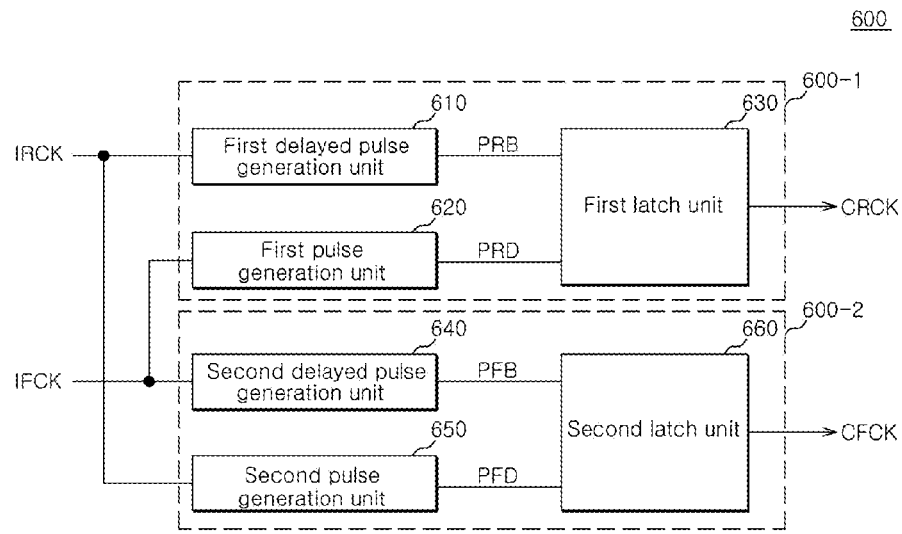
FIG. 1 is a block diagram illustrating a clock control circuit in accordance with one embodiment.

Wherever possible, the same reference numerals will be used throughout the drawings and the description to refer to the same or like parts.

Referring to FIG. 1, it can be seen that a clock control circuit 600 in accordance with one embodiment can include a first signal generation block 600-1 and a second signal generation block 600-2.

The first signal generation block 600-1 can be configured such that it outputs a first internal clock signal 'CRCK', which is enabled after the delay of a first time to (see FIG. 2) from the rising edge of an internal rising clock signal 'IRCK' and which has a high level pulse width shorter by a second time t2 (see FIG. 2) than the high level pulse width of the internal rising clock signal 'IRCK'.

The second signal generation block 600-2 can be configured such that it outputs a second internal clock signal 'CFCK', which is enabled after the delay of the first time t1 (see FIG. 2) from the rising edge of an internal falling clock signal 'IFCK' and which has a high level pulse width shorter by the second time t2 (see FIG. 2) than the high level pulse width of the internal falling clock signal 'IFCK'.

Still referring to FIG. 1, the first signal generation block 600-1 can include a first delayed pulse generation unit 610, a first pulse generation unit 620 and a first latch unit 630. Also, the second signal generation block 600-2 can include a second delayed pulse generation unit 640, a second pulse generation unit 650 and a second latch unit 660.

The first delayed pulse generation unit 610 can be configured to output a low level pulse having a pulse width of a third time t3 after the delay of the second time t2 (see FIG. 2) from the falling edge of the internal rising clock signal 'IRCK'. In detail, the first delayed pulse generation unit 610 can output a high level pulse at the falling edge of the internal rising clock signal 'IRCK', output the low level pulse for the third time t3 (see FIG. 2) after the delay of the second time t2 (see FIG. 2) from the falling edge of the internal rising clock signal 'IRCK', and output again a high level pulse after the lapse of the third time t3 (see FIG. 2). The first delayed pulse generation unit 610 can be realized using a delay circuit and a logic gate for outputting the first internal clock signal 'CRCK'.

In the embodiments described herein, the term "low level pulse" means a signal transited from a high level to a low level and re-transited from the low level to the high level. The low level is maintained for a specific timing interval. The term "high level pulse" means a signal transited from a low level to a high level and re-transited from the high level to the low level. The high level is maintained for a specific timing interval.

The second delayed pulse generation unit 640 can be configured in the same way as the first delayed pulse generation unit 610, except that the second delayed pulse generation unit 640 can be configured to output a low level pulse for the third time t3 (see FIG. 2) after the delay of the second time t2 (see FIG. 2) from the falling edge of the internal falling clock signal 'IFCK'.

The first pulse generation unit 620 can output a low level pulse having a pulse width of the third time t3 from the falling edge of the internal falling clock signal 'IFCK'. That is to say, the first pulse generation unit 620 can be configured to output the low level pulse for the third time t3 (see FIG. 2) from the falling edge of the internal falling clock signal 'IFCK' and then output a high level pulse. The first pulse generation unit 620 can be realized using a delay circuit and a logic gate.

The second pulse generation unit 650 can be configured in the same way as the first pulse generation unit 620, except that the second pulse generation unit 650 can be configured to output a low level pulse having a pulse width of the third time t3 (see FIG. 2) from the falling edge of the internal rising clock signal 'IRCK'.

The first latch unit 630 can be configured to receive the output signal of the first delayed pulse generation unit 610 and the output signal of the first pulse generation unit 620. The first latch unit 630 can be configured such that it is set and outputs a high level pulse when the output signal of the first delayed pulse generation unit 610 has a low level, and is reset and outputs a low level pulse when the output signal of the first pulse generation unit 620 has a low level.

Figure 5:
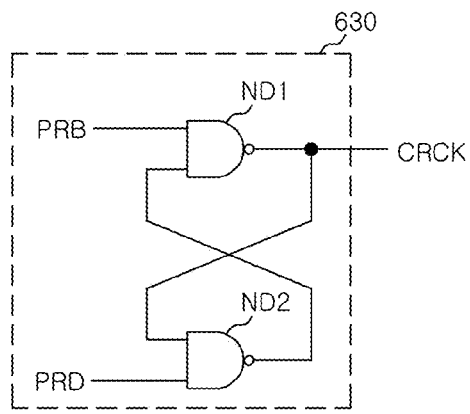
FIG. 5 is a block diagram illustrating an example of first and second latch units included in the circuit shown in FIG. 1.
Figure 5:
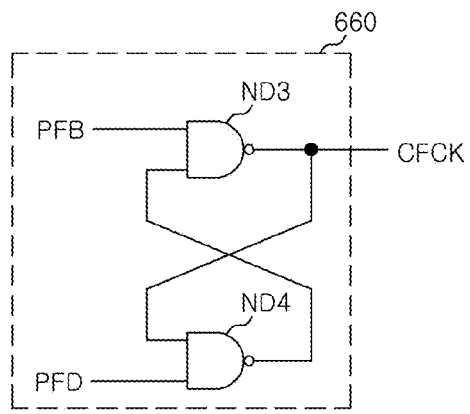

For example, the first latch unit 630 can be configured using NAND gates as shown in FIG. 5 or NOR gates. The second latch unit 660 can have substantially the same configuration as the first latch unit 630. The second latch unit 660 can be different from the first latch unit 630 in that the second latch unit 660 can receive the output signal of the second delayed pulse generation unit 640 and the output signal of the second pulse generation unit 650.

Figure 2:
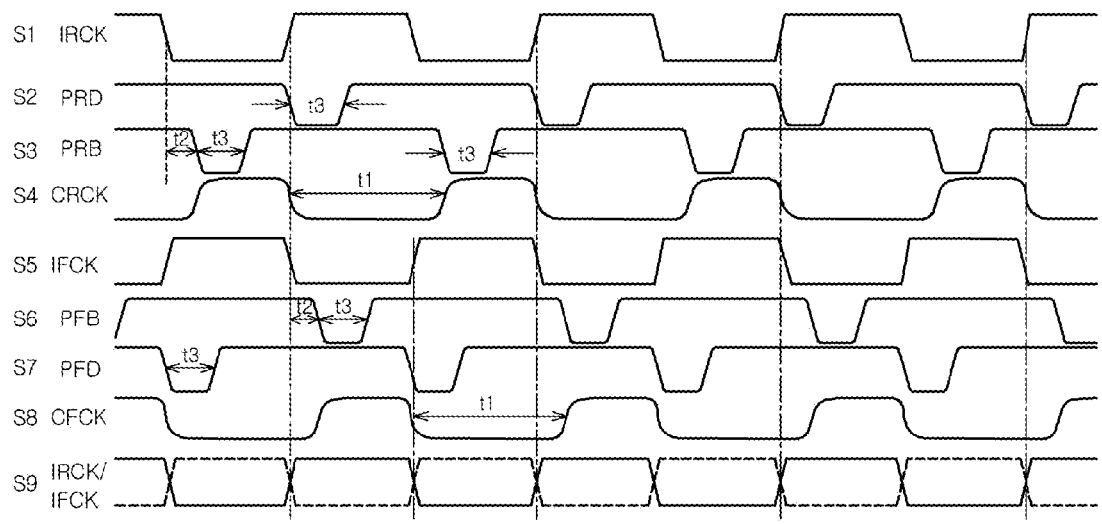
FIG. 2 is a timing diagram illustrating the operation of the clock control circuit shown in FIG. 1.

The operation of the clock control circuit 600 shown in FIG. 1 will now be described with reference to FIG. 2.

A first waveform S1 illustrates the internal rising clock signal 'IRCK', and a fifth waveform S5 illustrates the internal falling clock signal 'IFCK'. A ninth waveform S9 simultaneously illustrates the internal rising clock signal 'IRCK' (a solid line) and the internal falling clock signal 'IFCK' (a dotted line), wherein, since both signals overlap with each other at the rising edge and the falling edge as in a conventional circuit, problems can be caused due to increased noise generation and power consumption.

A third waveform S3 illustrates the output signal 'PRB' of the first delayed pulse generation unit 610. The output signal 'PRB' has a low level for the third time t3 after the delay of the second time t2 from the falling edge of the internal rising clock signal 'IRCK' and then has a high level.

A second waveform S2 illustrates the output signal 'PRD' of the first pulse generation unit 620. The output signal 'PRD' has a low level for the third time t3 from the falling edge of the internal falling clock signal 'IFCK' and then has a high level.

A fourth waveform S4 illustrates the output signal 'CRCK' of the first latch unit 630. In this example, the output signal 'CRCK' is set from the time when the output signal 'PRB' of the first delayed pulse generation unit 610 has a low level and maintains a high level, and is reset from the time when the output signal 'PRD' of the first pulse generation unit 620 has a low level and maintains a low level.

A sixth waveform S6 illustrates the output signal 'PFB' of the second delayed pulse generation unit 640. The output signal 'PFB' has a low level for the third time t3 after the delay of the second time t2 from the falling edge of the internal falling clock signal 'IFCK' and then has a high level.

A seventh waveform S7 illustrates the output signal 'PFD' of the second pulse generation unit 650. The output signal 'PFD' has a low level for the third time t3 from the falling edge of the internal rising clock signal 'IRCK' and then has a high level.

An eighth waveform S8 illustrates the output signal 'CFCK' of the second latch unit 660. In this example, the output signal 'CFCK' is set from the time when the output signal 'PFB' of the second delayed pulse generation unit 650 has a low level and maintains a high level, and is reset from the time when the output signal 'PFD' of the second pulse generation unit 650 has a low level and maintains a low level.

As shown, the first signal 'PRB' as the output signal of the first delayed pulse generation unit 610 and the second signal 'PRD' as the output signal of the first pulse generation unit 620 respectively, designate the pulse that has the low level for the third time t3 after the delay of the second time t2 from the falling edge of the internal rising clock signal 'IRCK' and the pulse that has the low level for the third time t3 from the falling edge of the internal falling clock signal 'IFCK'.

The first internal clock signal 'CRCK' as the output signal of the first latch unit 630 has a high level from the time when the first signal 'PRB' is at a low level and has a low level from the time when the second signal 'PRD' is at a low level. Since the falling edge of the internal falling clock signal 'IFCK' corresponds to the rising edge of the internal rising clock signal 'IRCK', the first internal clock signal 'CRCK' has a high level after the delay of the second time t2 from the falling edge of the internal rising clock signal 'IRCK'. It is to be appreciated that the first internal clock signal 'CRCK' goes to a low level from the rising edge of the internal rising clock signal 'IRCK' and has a high level interval shorter by the second time t2 than the internal rising clock signal 'IRCK'.

The second internal clock signal 'CFCK' can also be generated in substantially the same manner as the first internal clock signal 'CRCK'. That is to say, the second internal clock signal 'CFCK' can have a high level after the delay of the second time t2 from the falling edge of the internal falling clock signal 'IFCK' and a low level from the rising edge of the internal falling clock signal 'IFCK'. By this fact, it is to be appreciated that the second internal clock signal 'CFCK' can have a high level interval that is shorter by the second time t2 than the internal falling clock signal 'IFCK'. As a consequence, the clock control circuit 600 can output signals such that the rising edge of the first internal clock signal 'CRCK' and the falling edge of the second internal clock signal 'CFCK' do not overlap with each other and the falling edge of the first internal clock signal 'CRCK' and the rising edge of the second internal clock signal 'CFCK' do not overlap with each other.

Further, in the clock control circuit 600, since the interval between the rising edge of the first internal clock signal 'CRCK' and the rising edge of the second internal clock signal 'CFCK' can be maintained as it is, it is to be readily understood that, while the duty ratio between the first and second internal clock signals 'CRCK' and 'CFCK' is maintained as it is, the first and second internal clock signals 'CRCK' and 'CFCK' do not overlap with each other.

Figure 3:
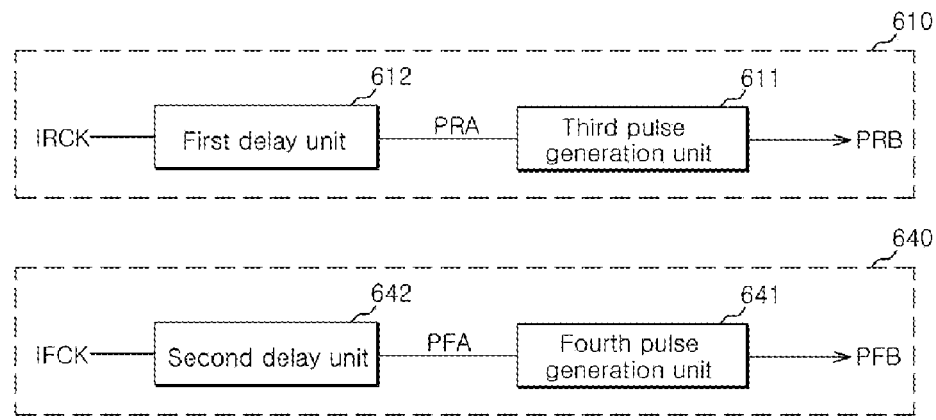
FIG. 3 is a block diagram illustrating an example of first and second delayed pulse generation units included in the circuit shown in FIG. 1.

Referring to FIG. 3, it can be seen that the first delayed pulse generation unit 610 can comprises a first delay unit 612 and a third pulse generation unit 611. It can also bee seen that the second delayed pulse generation unit 640 can comprise a second delay unit 642 and a fourth pulse generation unit 641.

The first delay unit 612 can be configured to delay the internal rising clock signal 'IRCK' for the second time t2. The first delay unit 612 can be configured using a delay circuit that has a delay corresponding to the second time t2. The first delay unit 612 can, e.g., be configured using a plurality of inverters, capacitors and resistors.

The third pulse generation unit 611 can be configured to output a low level pulse for the third time t3 from the falling edge of the output signal PRA of the first delay unit 612. The third pulse generation unit 611 can be configured using a delay circuit and a logic gate in the same way as the first pulse generation unit 620.

The second delay unit 642 and the fourth pulse generation unit 641 can be configured and function in the same way as the first delay unit 612 and the third pulse generation unit 611, except that the internal falling clock signal 'IFCK' is used as the input signal.

While not shown in the drawings, in the first delayed pulse generation unit 610, the first delay unit 612 and the third pulse generation unit 611 can be changed in their location and order. Namely, in certain embodiments, the first delayed pulse generation unit 610 shown in FIG. 3 can be configured in a manner such that the output signal of the first delay unit 612 is input to the third pulse generation unit 611 or the output signal of the third pulse generation unit 611 is input to the first delay unit 612 to output the same output signal 'PRB'.

Figure 4:
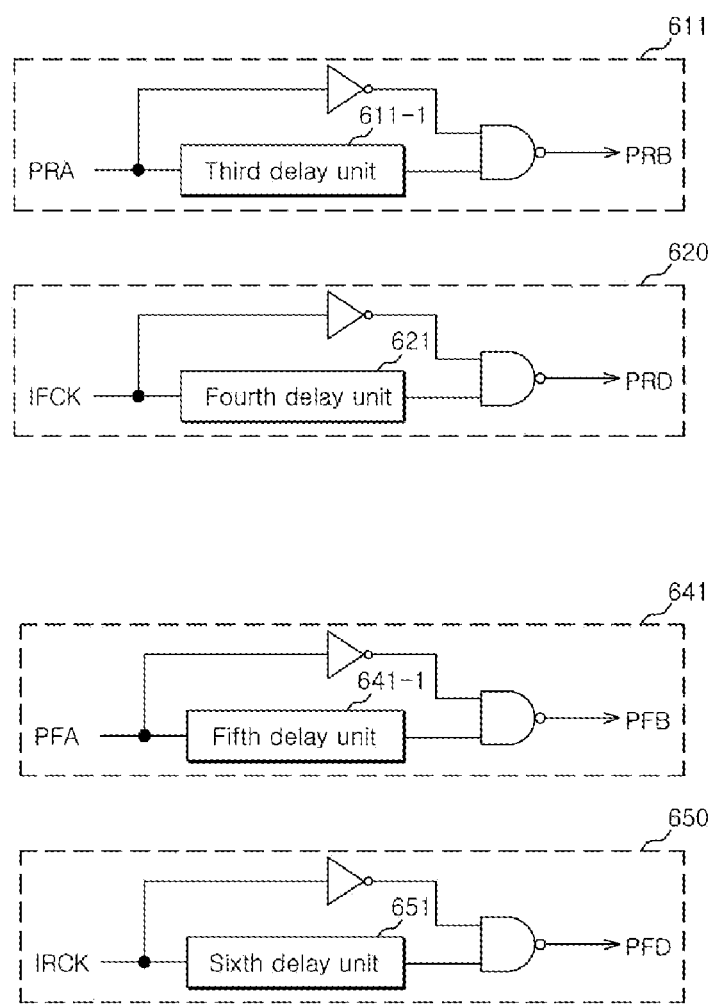
FIG. 4 is a block diagram illustrating an example of first, second, third and fourth pulse generation units included in the circuit shown in FIGS. 1 and 3.

Referring to FIG. 4, the first pulse generation unit 620 can comprise a fourth delay unit 621, which can be configured to delay the internal falling clock signal 'IFCK' for the third time t3, an inverter, which can invert the internal falling clock signal 'IFCK', and a NAND gate, which can receive and NAND the output signal of the fourth delay unit 621 and the output signal of the inverter.

The fourth delay unit 621 can be configured to delay the internal falling clock signal 'IFCK' for the third time t3 and can be configured using a conventional delay circuit.

In FIG. 4, the second, third and fourth pulse generation units 650, 611 and 641 can be configured in the same way as the first pulse generation unit 620, except that different input signals are received thereby.

Referring to FIG. 5, the first latch unit 630 can comprise a first NAND gate ND1, which can be configured to receive and NAND the output signal 'PRB' of the first delayed pulse generation unit 610 and the output signal of a second NAND gate ND2, and the second NAND gate ND2, which can receive and NAND the output signal of the first NAND gate ND1 and the output signal 'PRD' of the first pulse generation unit 620.

Therefore, if the output signal 'PRB' of the first delayed pulse generation unit 610 as the input signal to the first NAND gate ND1 has a low level, then the output signal of the first NAND gate ND1 has a high level, and if the output signal 'PRD' of the first pulse generation unit 620 as the input signal to the second NAND gate ND2 has a low level, then the output signal of the first NAND gate ND1 has a low level.

The second latch unit 660 can be configured using NAND gates in the same way as the first latch unit 630, except that the output signal 'PFB' of the second delayed pulse generation unit 640 and the output signal 'PFD' of the second pulse generation unit 650 are used as the input signals to the second latch unit 660. Accordingly, the output signals of the first and second latch units 630 and 660 can have a high level when the output signals 'PRB' and 'PFB' of the first and second delayed pulse generation units 610 and 640 have a low level, and have a low level when the output signals 'PRD' and 'PFD' of the first and second pulse generation units 620 and 650 have a low level.

In the present embodiment, the first and second internal clock signals 'CRCK' and 'CFCK' are output in a manner such that the rising edge of the first internal clock signal 'CRCK' and the falling edge of the second internal clock signal 'CFCK' do not overlap with each other and the falling edge of the first internal clock signal 'CRCK' and the rising edge of the second internal clock signal 'CFCK' do not overlap with each other. Also, in the present embodiment, the rising and falling clock signals generated by a clock driver, to which the first internal clock signal 'CRCK' and the second internal clock signal 'CFCK' are input, are output in a manner such that the rising edge of one signal and the falling edge of the other signal do not overlap with each other. Hence, an overlap does not occur in a pre-driver and an output buffer to which the rising and falling clock signals are input, due to pull-up and pull-down between first data and second data, whereby noise generation is suppressed, the distortion of a waveform is avoided and power consumption is reduced.

Figure 6:
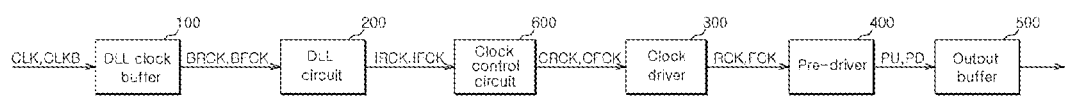
FIG. 6 is a block diagram illustrating an example of the semiconductor integrated circuit that includes the clock control circuit of FIG. 1.

Referring to FIG. 6, a semiconductor integrated circuit, which incorporates the clock control circuit 600, can comprise a DLL clock buffer 100, a DLL circuit 200, the clock control circuit 600, a clock driver 300, a pre-driver 400, and an output buffer 500. Among these component elements, the clock control circuit 600 is configured such that it receives the internal rising and falling clock signals 'IRCK' and 'IFCK' and generates the first internal clock signal 'CRCK' and the second internal clock signal 'CFCK', which do not overlap with each other. The detailed configuration of the clock control circuit 600 can be realized as shown in FIGS. 1 through 5.

The DLL clock buffer 100 can receive external clock signals 'CLK' and 'CLKB' and can generate internal reference DLL clock signals 'BRCK' and 'BFCK'. The DLL clock buffer 100 can be realized using a conventional DLL clock buffer.

The DLL circuit 200 can receive the internal reference DLL clock signals 'BRCK' and 'BFCK' and can generate the internal rising clock signal 'IRCK' and the internal falling clock signal 'IFCK'. The DLL circuit 200 can be realized using a conventional DLL circuit.

The clock driver 300 can receive the first internal clock signal 'CRCK' and the second internal clock signal 'CFCK' and can generate rising and falling clock signals 'RCK' and 'FCK'. The clock driver 300 can be realized using a conventional clock driver.

The pre-driver 400 and the output buffer 500 can receive and drive the rising and falling clocks 'RCK' and 'FCK' and output data. The pre-driver 400 and the output buffer 500 can be realized using a conventional pre-driver and a conventional output buffer.

While it was described that the clock control circuit according to the embodiments described herein can receive the internal rising and falling clock signals 'IRCK' and 'IFCK' as the output signals of the DLL circuit 200 and generate the first and second internal clock signals 'CRCK' and 'CFCK', the clock control circuit as described herein can be implemented such that it receives general clock signals and prevents the rising edge of a clock signal and the falling edge of a clock inversion signal from overlapping with each other.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A clock control circuit, comprising:
   a first signal generation block configured to output a first internal clock signal, which is enabled after delay of a first time from a rising edge of a first input clock signal and disabled in synchronization with a falling edge of a second input clock signal; and
   a second signal generation block configured to output a second internal clock signal, which is enabled after delay of the first time from a rising edge of a second input clock signal and disabled in synchronization with a falling edge of the first input clock signal.

2. The clock control circuit according to claim 1, wherein the first internal clock signal has a low level when the first input clock signal transits low.

3. The clock control circuit according to claim 1, wherein the second internal clock signal has a low level when the second input clock signal transits low.

4. The clock control circuit according to claim 1, wherein the first signal generation block comprises:
   a first delayed pulse generation unit configured to output a pulse of a low level for a third time after delay of a second time from the falling edge of the first input clock signal;
   a first pulse generation unit configured to output a pulse of a low level for the third time from the falling edge of the second input clock signal; and
   a first latch unit configured to receive an output signal of the first delayed pulse generation unit and an output signal of the first pulse generation unit, is set and outputs a signal of a high level from a time when the output signal of the first delayed pulse generation unit has a low level, and is reset and outputs a signal of a low level from a time when the output signal of the first pulse generation unit has a low level.

5. The clock control circuit according to claim 4, wherein the first delayed pulse generation unit comprises:
   a first delay unit configured to delay the first input clock signal for the second time; and
   a third pulse generation unit configured to output a pulse of a low level for the third time from a falling edge of an output signal of the first delay unit.

6. The clock control circuit according to claim 4, wherein the first delayed pulse generation unit comprises:
   a third pulse generation unit configured to output a pulse of a low level for the third time from the falling edge of the first input clock signal; and
   a first delay unit configured to delay an output signal of the third pulse generation unit for the second time.

7. The clock control circuit according to claim 1, wherein the second signal generation block comprises:
   a second delayed pulse generation unit configured to output a pulse of a low level for a third time after delay of a second time from the falling edge of the second input clock signal;
   a second pulse generation unit configured to output a pulse of a low level for the third time from the falling edge of the first input clock signal; and
   a second latch unit configured to receive an output signal of the second delayed pulse generation unit and an output signal of the second pulse generation unit, is set and outputs a signal of a high level from a time when the output signal of the second delayed pulse generation unit has a low level, and is reset and outputs a signal of a low level from a time when the output signal of the second pulse generation unit has a low level.

8. The clock control circuit according to claim 7, wherein the second delayed pulse generation unit comprises:
   a second delay unit configured to delay the second input clock signal for the second time; and
   a fourth pulse generation unit configured to output a pulse of a low level for the third time from a falling edge of an output signal of the second delay unit.

9. The clock control circuit according to claim 7, wherein the second delayed pulse generation unit comprises:
   a fourth pulse generation unit configured to output a pulse of a low level for the third time from the falling edge of the second input clock signal; and
   a second delay unit configured to delay an output signal of the fourth pulse generation unit for the second time.

10. The clock control circuit according to claim 1, wherein the first input clock signal is an inversion signal of the second input clock signal.

11. The clock control circuit according to claim 1, wherein the first and second input clock signals are DLL clock signals, which are output signals of a DLL circuit.

12. A semiconductor integrated circuit, comprising:
   a DLL circuit configured to output a DLL clock signal in response to an external clock signal;
   a signal generation block configured to output an internal clock signal, which is enabled after delay of a first time from a rising edge of the DLL clock signal and disabled in synchronization with a falling edge of an inversion signal of the DLL clock signal; and
   an output driver configured to receive, buffer and output the internal clock signal,
   wherein the signal generation block comprises:

a first delayed pulse generation unit configured to output a pulse of a low level for a third time after delay of a second time from a falling edge of the DLL clock signal;

a first pulse generation unit configured to output a pulse of a low level for the third time from the falling edge of an inversion signal of the DLL clock signal; and a first latch unit configured to receive an output signal of the first delayed pulse generation unit and an output signal of the first pulse generation unit, is set and outputs a signal of a high level from a time when the output signal of the first delayed pulse generation unit has a low level, and is reset and outputs a signal of a low level from a time when the output signal of the first pulse generation unit has a low level.

13. The semiconductor integrated circuit according to claim 12, wherein the internal clock signal has a low level when the DLL clock signal transits low.

14. The semiconductor integrated circuit according to claim 12, wherein the first delayed pulse generation unit comprises:

a first delay unit configured to delay the DLL clock signal for the second time; and a second pulse generation unit configured to output a pulse of a low level for the third time from a falling edge of an output signal of the first delay unit.

15. The semiconductor integrated circuit according to claim 12, wherein the first delayed pulse generation unit comprises:

a second pulse generation unit configured to output a pulse of a low level for the third time from the falling edge of the DLL clock signal; and a first delay unit configured to delay an output signal of the second pulse generation unit for the second time.

* * * * *